(12) United States Patent
Miyamae

(10) Patent No.: US 9,831,893 B2
(45) Date of Patent: Nov. 28, 2017

(54) INFORMATION PROCESSING DEVICE, DATA COMPRESSION METHOD AND DATA COMPRESSION PROGRAM

(71) Applicant: FUJITSU LIMITED, Kawasaki-shi, Kanagawa (JP)

(72) Inventor: Takeshi Miyamae, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/423,632

(22) Filed: Feb. 3, 2017

(65) Prior Publication Data
US 2017/0264311 A1 Sep. 14, 2017

(30) Foreign Application Priority Data
Mar. 10, 2016 (JP) .................. 2016-047039

(51) Int. Cl.
H03M 7/34 (2006.01)
H03M 7/30 (2006.01)

(52) U.S. Cl.
CPC ................. *H03M 7/6082* (2013.01)

(58) Field of Classification Search
CPC ..... H03M 7/6082; H03M 7/42; H03M 7/4006
USPC ................................. 341/51–55
See application file for complete search history.

(56) References Cited

U.S. PATENT DOCUMENTS

| 5,479,210 A | 12/1995 | Cawley et al. | |
|---|---|---|---|
| 2011/0211636 A1* | 9/2011 | Yamada | H03M 7/4006 375/240.12 |
| 2012/0044216 A1* | 2/2012 | Furihata | G09G 3/3688 345/204 |
| 2013/0060992 A1* | 3/2013 | Cho | G06F 12/0246 711/103 |
| 2014/0185103 A1* | 7/2014 | Tsugimura | H04N 1/4115 358/426.09 |
| 2016/0223675 A1 | 8/2016 | Miura et al. | |

FOREIGN PATENT DOCUMENTS

| JP | H04-241681 | 8/1992 |
|---|---|---|
| JP | H07-170489 | 7/1995 |
| JP | 2007-025073 | 2/2007 |
| JP | 2016-142595 | 8/2016 |

\* cited by examiner

*Primary Examiner* — Lam T Mai
(74) *Attorney, Agent, or Firm* — Fujitsu Patent Center

(57) ABSTRACT

An information processing device includes: a memory; and a processor coupled to the memory and the processor configured to: generate compressed data, in sets of a prescribed size, in respect of one set of object data, in accordance with each of a plurality of compression methods; and select compressed data of the compression method which has completed compression of the object data first, among the plurality of compression methods.

6 Claims, 9 Drawing Sheets

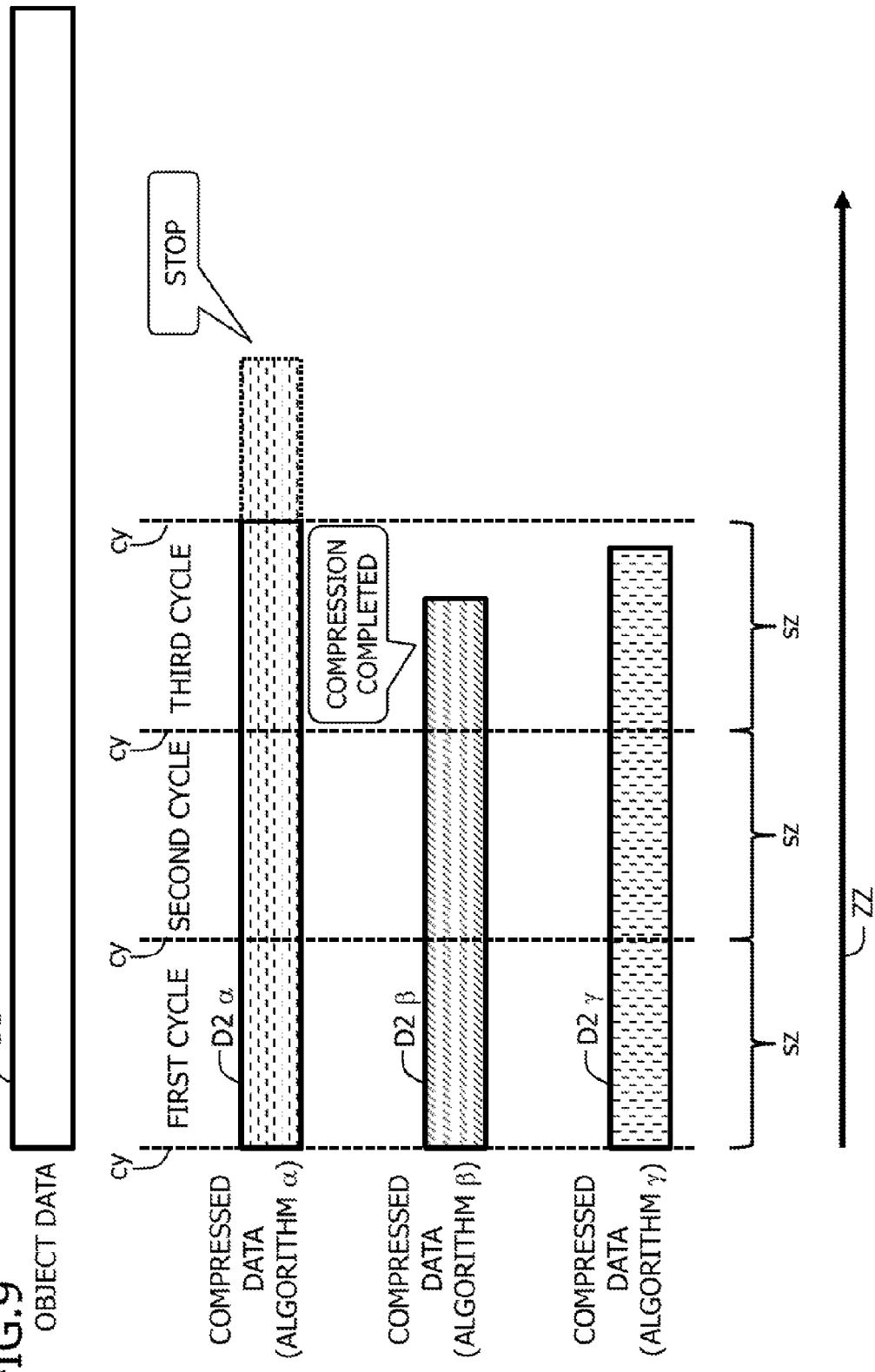

US 9,831,893 B2

INFORMATION PROCESSING DEVICE, DATA COMPRESSION METHOD AND DATA COMPRESSION PROGRAM

CROSS-REFERENCE TO RELATED APPLICATION

This application is based upon and claims the benefit of priority of the prior Japanese Patent Application No. 2016-047039, filed on Mar. 10, 2016, the entire contents of which are incorporated herein by reference.

FIELD

The present invention relates to an information processing device, a data compression method and a data compression program.

BACKGROUND

Recently, there have been many developments in algorithms for compressing data (also called "compression methods" below). The data compression ratio varies with the compression method. Furthermore, even when using the same compression method, the data compression ratio also varies with the contents of the data that is to be compressed (called "object data" below). Therefore, the compression method which has a high compression ratio and results in a small data size after compression varies with the object data.

Consequently, in order to determine a compression method having a high compression ratio for object data, there is a method which compresses the object data in accordance with each of a plurality of compression methods and then determines the compression method having the highest compression ratio on the basis of the compression results. However, since the data is compressed by using each of the plurality of compression methods, then the time taken for compression becomes long.

On the other hand, there is also a method in which a portion, rather than the whole, of the object data is compressed in accordance with each of a plurality of compression methods and the compression method is determined on the basis of the compression results. This method reduces the time taken for compression, since only a portion of the object data is compressed.

Technology relating to compression methods is described, for example, in Japanese Laid-open Patent Publication No. H04-241681, Japanese Laid-open Patent Publication No. 2007-25073 and Japanese Laid-open Patent Publication No. H07-170489.

SUMMARY

The contents of the object data are not necessarily uniform, and therefore the compression method having the highest compression ratio when a portion of the object data is compressed may differ from the compression method having the highest compression ratio when all of the object data is compressed. Furthermore, there are cases where, depending on the compression method, the compression ratio when a portion of the object data is compressed is lower than the compression ratio when all of the object data is compressed.

Consequently, it is impossible to determine the compression method having the highest compression ratio unless all of the object data is compressed. Meanwhile, if all of the object data is compressed, then the time taken for compression becomes long compared to when a portion of the object data is compressed.

According to an aspect of the embodiments, an information processing device includes: a memory; and a processor coupled to the memory and the processor configured to: generate compressed data, in sets of a prescribed size, in respect of one set of object data, in accordance with each of a plurality of compression methods; and select compressed data of the compression method which has completed compression of the object data first, among the plurality of compression methods.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 9 illustrates a schematic view of a flow of processing in a case where compression of the whole of the object data D1 is completed by a plurality of algorithms during the same cycle.

DESCRIPTION OF EMBODIMENTS

Embodiments will be described hereinafter according to the drawings. However, it is noted that the technical scope is not limited to the embodiments described below, but covers the matters described in the claims and the equivalents thereof.

[Data Compression]

Figure 1:
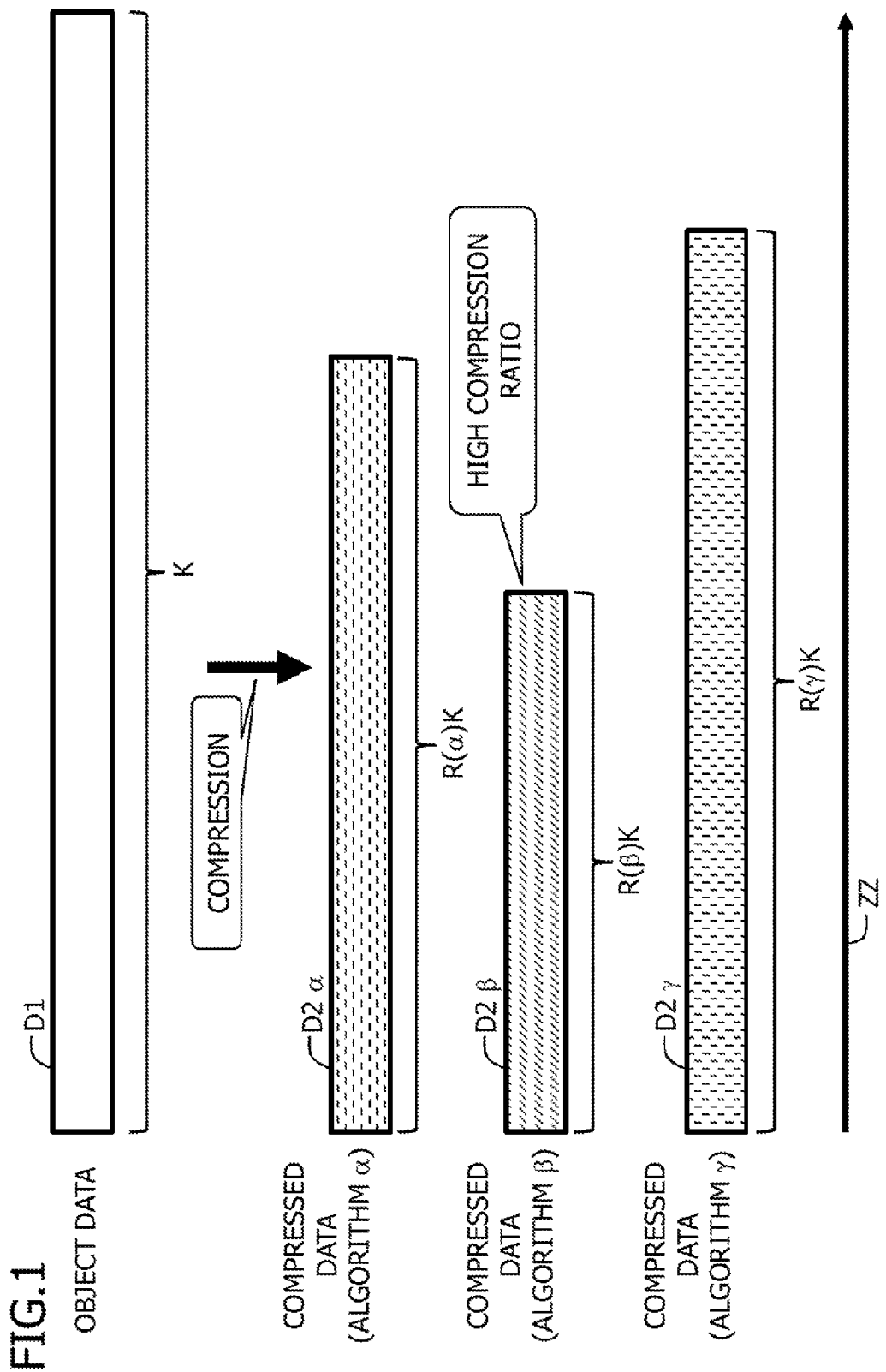
FIG. 1 is a diagram illustrating a schematic depiction of the compression of data.

FIG. 1 is a diagram illustrating a schematic depiction of the compression of data. An information processing device (not illustrated in FIG. 1) compresses and stores data in order to store a large volume of data in a memory device, such as a storage device. In order to be able to store a greater volume of data, it is desirable to convert the data to compressed data of a smaller size, in accordance with a compression method (called "algorithm" below) having a high compression ratio.

Compression is a process in which data that is the object of compression (called "object data" below) D1 is converted into data having a reduced size (data volume) after compression (called "compressed data" below), while maintaining the substantial content (substance) of the object data. Furthermore, the compression ratio (%) is the ratio between the size of the object data D1 and the size of the compressed data. A formula for calculating the compression ratio is illustrated in Expression 1.

Compression ratio=(size of compressed data/size of object data)*100 (Expression 1)

As illustrated in Expression 1, the calculated compression ratio becomes smaller, the smaller the size of the compressed data. In other words, the compression ratio calculated by Expression 1 becomes smaller, the greater the volume of data removed by the compression. Meanwhile, the compression ratio calculated by Expression 1 becomes larger, the greater the size of the compressed data and the smaller the volume of data removed by the compression.

In the present embodiment, when the compression ratio calculated by Expression 1 is small (the volume of removed data is large), this is expressed as a high compression ratio. Similarly, in the present embodiment, when the compression ratio calculated by Expression 1 is large (the volume of removed data is small), this is expressed as a low compression ratio. Hereinafter, in the present embodiment, the compression ratio is described on the basis of this "high/low" expression.

FIG. 1 illustrates an example where object data D1 is compressed respectively in accordance with three algorithms $\alpha$, $\beta$, $\gamma$. The arrow ZZ indicated in FIG. 1 represents the size of data. The object data D1 is, for example, data having a size from several tens of gigabytes (GB) to approximately several hundred GB.

The compressed data D2$\alpha$ indicated by the rectangle marked with horizontal dashes in FIG. 1 is compressed data obtained by compressing the object data D1 in accordance with the algorithm $\alpha$. Similarly, the compressed data D2$\beta$ indicated by the rectangle marked with diagonal dashes in FIG. 1 is compressed data based on algorithm $\beta$, and the compressed data D2$\gamma$ indicated by the rectangle marked with vertical dashes is compressed data based on algorithm $\gamma$. Below, the compressed data D2$\alpha$, D2$\beta$, D2$\gamma$ is also called "compressed data D2".

$$0 < R(\beta) < R(\alpha) < R(\gamma) < 1 \quad \text{Expression 2}$$

Expression 2 is a formula representing the relationship between the compression ratios of the algorithms $\alpha$, $\beta$, $\gamma$, when the object data D1 is compressed. The value "R" in Expression 2 indicates a compression ratio. Therefore, the value "R($\alpha$)" indicates the compression ratio of algorithm $\alpha$, the value "R($\beta$)" indicates the compression ratio of algorithm $\beta$, and value "R($\gamma$)" indicates the compression ratio of algorithm $\gamma$.

Furthermore, when the size of the object data D1 is the value "K", then the size of the compressed data D2$\alpha$ is the value "R($\alpha$)K". Similarly, the size of the compressed data D2$\beta$ is the value "R($\beta$)K" and the size of the compressed data D2$\gamma$ is the value "R($\gamma$)K".

As indicated in Expression 2, in the example in FIG. 1, of the algorithms $\alpha$, $\beta$, $\gamma$, the compression ratio "R($\beta$)" of algorithm $\beta$ is the highest, and the compression ratio "R($\gamma$)" of algorithm $\gamma$ is the lowest. Therefore, as illustrated in FIG. 1, the size "R($\beta$)K" of the compressed data D2$\beta$ is the smallest and the size "R($\gamma$)K" of the compressed data D2$\gamma$ is the largest.

(Example of Algorithm)

The algorithm $\alpha$ in the present embodiment is, for example, run length encoding. Furthermore, the algorithm $\beta$ is LZ77 (Lempel-Ziv1977: LZ77) encoding and the algorithm $\gamma$ is LZ78 (Lempel-Ziv1978: LZ78) encoding.

Run length encoding is a method which compresses the object data D1 on the basis of the number of consecutive occurrences of the same value (run length). With run length encoding, consecutive occurrences of the same value in the object data D1 are encoded by being replaced with the value in question, and the number of consecutive occurrences.

LZ77 encoding and LZ78 encoding are types of LZ encoding (dictionary method). In the dictionary method, when an input signal sequence is present in a previous signal sequence, the input signal sequence is encoded by being replaced with the position and length of the previous signal sequence.

More specifically, in LZ77 encoding (sliding dictionary method), it is determined whether or not a signal sequence starting from a particular position in the object data D1 has appeared previously, and if the signal sequence has appeared previously, the signal sequence is replaced with values indicating the appearance position and length. LZ77 encoding is called a sliding dictionary method, because a search range of the signal sequence (sliding window) is used as a dictionary.

Furthermore, in LZ78 encoding (dynamic dictionary method), a dictionary is created dynamically in accordance with the signal sequence in the object data D1. In LZ78 encoding, when the input signal sequence is present in the dictionary, the input signal sequence is replaced with values indicating the appearance position and length, and when the input signal sequence is not present, it is registered in the dictionary.

The algorithms $\alpha$, $\beta$, $\gamma$ are not limited to these examples. The algorithms $\alpha$, $\beta$, $\gamma$ may be other algorithms, such as Huffman coding, arithmetic coding, or the like.

(Determination of Algorithm Having High Compression Ratio)

As illustrated in FIG. 1, the compression ratio when the object data D1 is compressed varies depending on the algorithm. Furthermore, even when the same algorithm is used, the compression ratio varies depending on the contents of the object data D1. For example, with run length encoding, the compression ratio becomes higher, the greater the number of consecutive values in the object data D1. Furthermore, with LZ encoding, the compression ratio becomes higher, the greater the number of identical signal sequences in the object data D1.

Consequently, there are methods for determining an algorithm having a high compression ratio, on the basis of the type of object data D1. The type indicates the characteristics of the contents of the object data D1, for example, images, text, graphics, etc. The information processing device, for instance, classifies the object data D1 by type. The information processing device then compresses the object data D1 in accordance with an algorithm having a high compression ratio for data of the classified type.

However, it is not easy to classify the object data D1 into an appropriate type. Furthermore, the object data D1 may correspond to a plurality of types. For instance, there are cases where the object data D1 contains both text and images. In this case, it is not easy to classify the type of the object data D1 appropriately.

(Speculative Execution of Compression)

On the other hand, there is also a method which compresses the object data D1 in accordance with each of a plurality of algorithms, and determines the algorithm having the highest compression ratio, from among the plurality of algorithms, on the basis of the compression results (compression ratios). Carrying out compression in this way regardless of the fact that the compressed data D2 thus generated may also not be used is called speculative execution of compression. Speculative execution of compression includes a method in which speculative compression of the whole of the object data D1 is carried out and a method in which speculative compression of a portion of the object data D1 is carried out.

Firstly, a case where speculative compression of the whole of the object data D1 is carried out will be described. The information processing device compresses the whole of the object data D1 in accordance with the algorithms α, β, γ, to generate compressed data D2α, D2β, D2γ. The information processing device then determines that the algorithm β of the compressed data D2β having the smallest size is the algorithm having the highest compression ratio. The information processing device also deletes the compressed data D2α and D2γ of the other algorithms.

Next, a case where speculative compression of a portion of the object data D1 is carried out will be described. The information processing device samples a portion of data from the object data D1 and compresses that data in accordance with the algorithms α, β, γ, to generate partial compressed data. The information processing device then infers that the algorithm yielding the smallest size of partial compressed data is the algorithm that would have the highest compression ratio in the event of compressing the whole of the object data D1. The information processing device then compresses the whole of the object data D1 in accordance with the algorithm thus inferred.

When compressing a portion of the object data D1, the volume of data to be compressed is smaller than when compressing the whole of the object data D1. Therefore, when speculative compression is carried out on a portion of the object data D1, it is possible to reduce the time taken by the compression process, compared to a case where speculative compression is carried out on the whole of the object data D1.

However, if speculative compression is carried out on a portion of the object data D1, there may be cases where it is not possible to accurately infer the algorithm that would have the highest compression ratio in the event of compressing the whole of the object data D1. More specifically, the algorithm having the highest compression ratio when compressing a portion of the object data D1 may be different to the algorithm having the highest compression ratio when compressing the whole of the object data D1. The reasons for this are explained below.

Firstly, the contents of the object data D1 are not necessarily uniform. Furthermore, as stated above, the object data D1 may include data of multiple types (text and images, etc.). Therefore, even if the data is compressed in accordance with the same algorithm, the compression ratio varies depending on the contents of the portion of data that is sampled. Consequently, the ranking of the compression ratios of the algorithms when compressing a portion of the object data D1 may differ from the ranking when compressing the whole of the data.

Secondly, depending on the algorithm, the compression ratio when compressing a portion of the object data D1 may be lower than the compression ratio when compressing the whole of the object data D1. For example, with LZ78 encoding, a dictionary is generated on the basis of the data that is to be compressed, and the data to be compressed is encoded in accordance with this dictionary.

Therefore, with LZ78 encoding, when a portion of the object data D1 is compressed, the volume of data registered in the dictionary is reduced compared to when the whole of the object data D1 is compressed. Consequently, the signal sequences that can be encoded are reduced and the compression ratio declines. As a result of this, there are cases where, despite the fact that the compression ratio of the LZ78 encoding method is highest when compressing the whole of the data, another algorithm has a higher compression ratio when compressing a portion of the data.

In this way, even with speculative execution, it is not possible to accurately determine the algorithm that would have the highest compression ratio when compressing the whole of the object data D1, unless the whole of the object data D1 is compressed. However, when the whole of the object data D1 is compressed, the time taken for compression is longer than when a portion of the object data D1 is compressed. In this way, it is not easy to acquire compressed data D2 based on the algorithm having the highest compression ratio, in a short period of time.

First Embodiment

The information processing device according to the first embodiment generates compression data, in sets of a prescribed size, from one set of object data D1, in accordance with each of a plurality of compression methods (algorithms). Then the information processing device selects the compressed data D2 of the algorithm which has completed compression first, of the plurality of algorithms.

In other words, the information processing device according the present embodiment compresses the object data D1 in such a manner that the size of the compressed data is uniform between a plurality of algorithms. Consequently, the compression process based on the algorithm having the highest compression ratio and yielding the smallest size of compressed data D2, among the plurality of algorithms, is completed first. Furthermore, in this case, since the algorithm having the highest compression ratio is identified, then the information processing device can omit the remainder of the compression process based on the other algorithms.

Consequently, the information processing device is able rapidly to acquire the compressed data D2 based on the algorithm having the highest compression ratio (in other words, yielding the smallest data size) by selecting the compressed data D2 of the algorithm in which the compression of the object data D1 is completed first.

[Compression Process According to First Embodiment]

Figure 2:
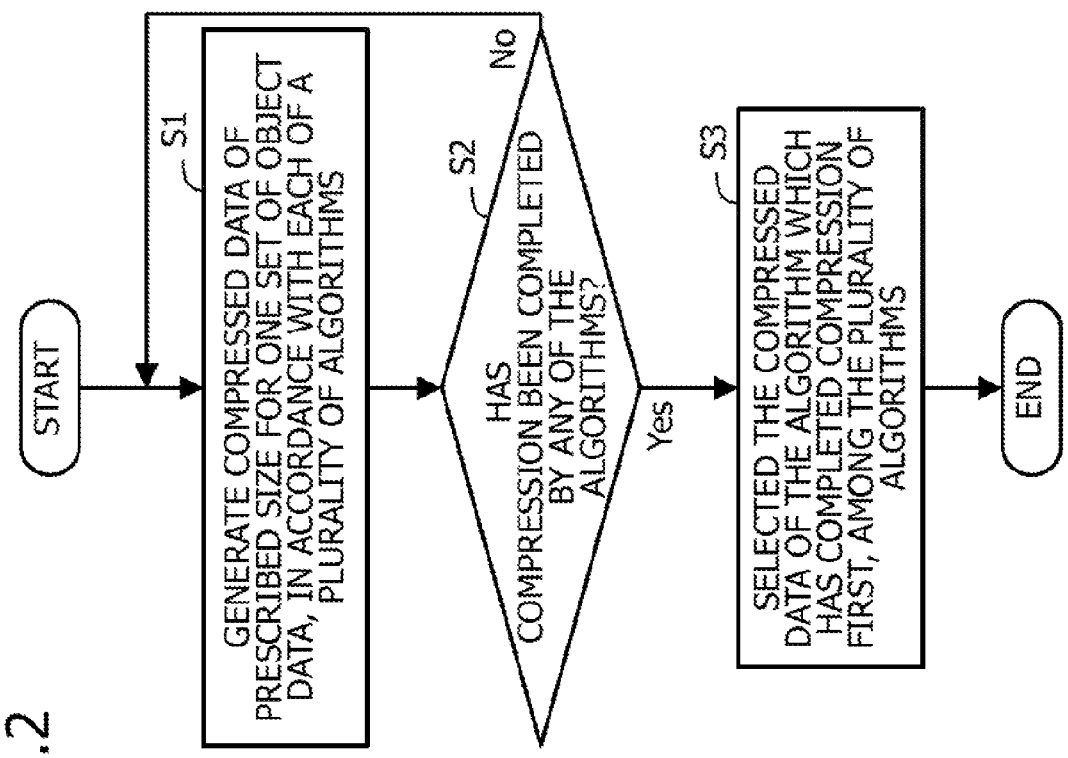
FIG. 2 is a flowchart diagram illustrating a flow of compression processing in the first embodiment.

FIG. 2 is a flowchart diagram illustrating a flow of compression processing in the first embodiment. FIG. 2 illustrates an overview of the compression process in accordance with the example in FIG. 1.

S1: The information processing device generates respective sets of compressed data of a prescribed size, in respect of one set of object data D1 (FIG. 1), in accordance with each of the algorithms α, β, γ (FIG. 1).

S2: When the respective sets of compressed data have been generated, the information processing device determines whether or not the compression of object data D1 has been completed on the basis of any of the algorithms α, β, γ. If the compression of the object data D1 has not been completed on the basis of any of the algorithms α, β, γ (No at S2), then the information processing device carries out the processing in step S1.

As indicated in steps S1 and S2, the information processing device generates sets of compressed data of a prescribed size, in respect of one set of object data D1, in accordance with each of the plurality of algorithms α, β, γ. In other words, the information processing device repeats a cycle of generating sets of compressed data of the prescribed size on the basis of the algorithms α, β, γ.

S3: If the compression has been completed on the basis of any of the algorithms α, β, γ, (Yes at S2), then the information processing device selects the compressed data D2 of the algorithm which has completed compression of the whole of the object data D1 first, of the plurality of algorithms α, β, γ. In other words, the information processing device is used to select, store and transmit the compressed data D2 of the algorithm which completes compression in the smallest number of cycles. In this way, the information processing device applies the algorithm which completes compression first.

Although not depicted in the drawings, the information processing device according to the first embodiment is provided with a central processing unit (CPU) and a main memory. The CPU implements the data compression process illustrated in the flowchart in FIG. 2 by executing a data compression program loaded into the main memory.

[Example of Compression Process According to First Embodiment]

Figure 3:
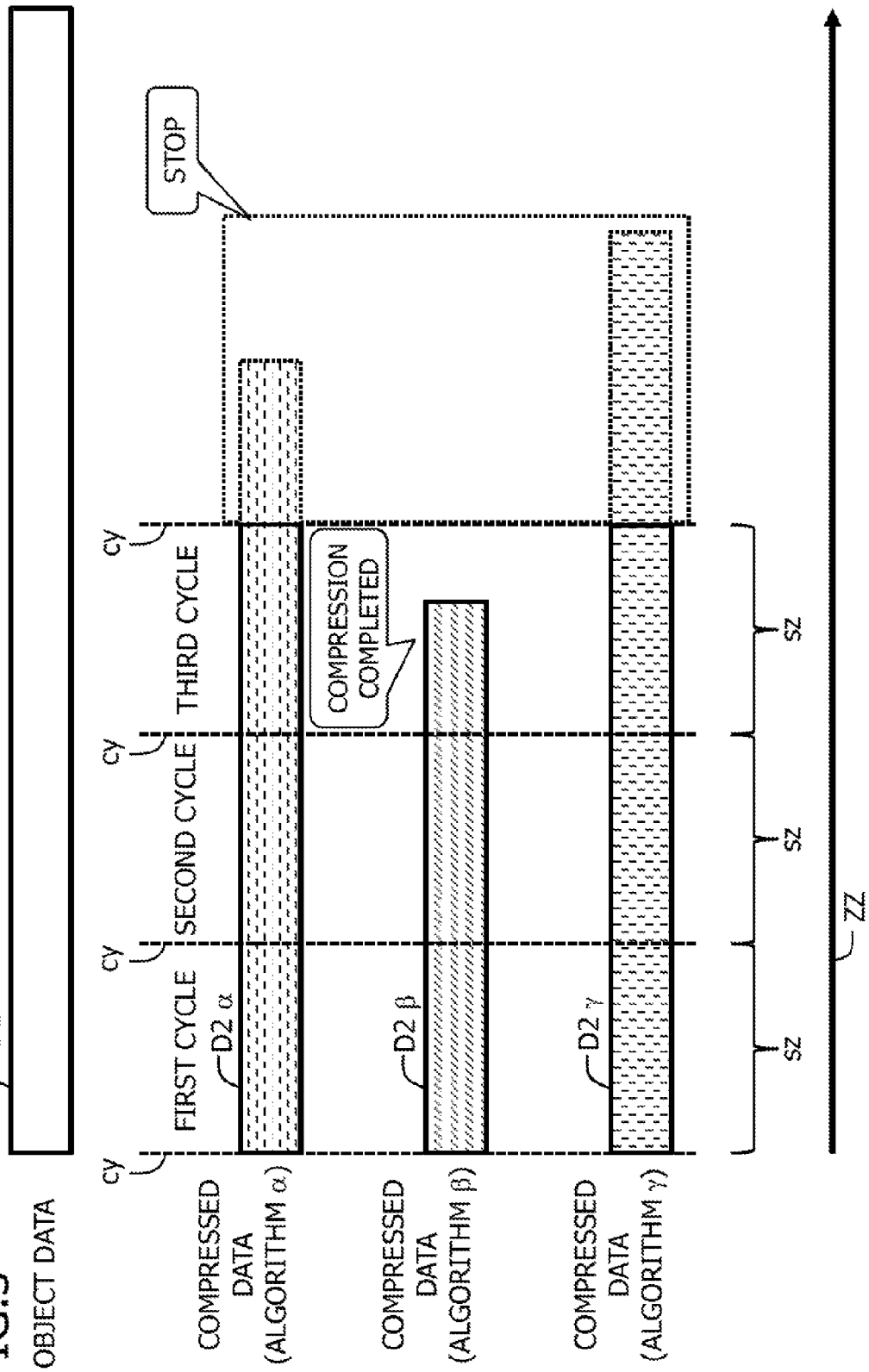
FIG. 3 is a diagram depicting a schematic view of one example of a compression process according to a first embodiment.

FIG. 3 is a diagram depicting a schematic view of one example of a compression process according to a first embodiment. In FIG. 3, parts which are the same as those depicted in FIG. 1 are labelled with the same reference symbols. The vertical broken line cy depicted in FIG. 3 indicates a division between cycles. The cycle is switched when the compressed data generated by each of the algorithms within the cycle in question has reached the prescribed size sz, respectively.

As stated above, the information processing device according to the present embodiment generates compressed data, in sets of a prescribed size sz, in accordance with each of the algorithms α, β, γ. This means that the object data D1 is compressed while maintaining a uniform size of the compressed data between the algorithms α, β, γ.

On the other hand, as stated in FIG. 1, the compression ratio varies between the algorithms α, β, γ, and the size of the compressed data D2 yielded by each algorithm α, β, γ is different. Therefore, if the size of the compressed data generated in each cycle is made uniform between the algorithms α, β, γ, then the rate of progress of the compression by the respective algorithms α, β, γ varies in accordance with the size of the compressed data D2.

(Rate of Progress of Compression)

$$\text{Rate of progress} = \text{Size of compressed data at end of cycle/Size of compressed data } D2 \text{ upon completion} \quad \text{Expression 3}$$

Expression 3 is a formula for calculating the rate of progress of the compression based on each of the algorithms α, β, γ. The "size of compressed data D2 upon completion" in Expression 3 is as stated above in FIG. 1. In other words, the compressed data D2α from the algorithm α has the size "R(α)K", the compressed data D2β from the algorithm β has the size "R(β)K", and the compressed data D2γ from the algorithm γ has the size "R(γ)K". Furthermore, the "size of compressed data at end of cycle" in Expression 3 is the value "sz*number of cycles".

Consequently, according to Expression 3, the rate of progress of the algorithm α is the value "(sz*number of cycles)/R(α)K". Similarly, the rate of progress of the algorithm β is the value "(sz*number of cycles)/R(β)K" and the rate of progress of the algorithm γ is "(sz*number of cycles)/R(γ)K".

$$1/R(\alpha):1/R(\beta):1/R(\gamma) \quad \text{Expression 4}$$

Expression 4 indicates the ratio between the rates of progress of the algorithms α, β, γ based on the rate of progress indicated by Expression 3. As indicated in Expression 4, the ratio of the rate of progress is larger, the higher the compression ratio (the smaller the value). In the present embodiment, the compression ratio "R(β)" of the algorithm β is highest, and therefore the rate of progress of compression by algorithm β is greatest. The greater the rate of progress, the faster the compression is completed. Therefore, compression is completed first by algorithm β, among the algorithms α, β, γ. Here, the flow of the processing in each cycle will be explained.

(First Cycle)

The information processing device respectively generates compressed data of a prescribed size sz, in accordance with the algorithms α, β, γ, for the object data D1. According to the example in FIG. 3, in the first cycle, compression of the whole of the object data D1 has not been completed in any of the algorithms α, β, γ, when each of the sets of compressed data has reached the prescribed size sz. The processing of the first cycle ends when all of the sets of compressed data have reached the prescribed size sz.

(Second Cycle)

The information processing device generates respective sets of compressed data of the prescribed size sz, in accordance with the algorithms α, β, γ, as a continuation of the first cycle. Similarly to the first cycle, in the second cycle also, compression of the whole of the object data D1 is not completed by any of the algorithms α, β, γ. When all of the sets of compressed data have reached the prescribed size sz, the processing of the second cycle terminates.

(Third Cycle)

The information processing device generates respective sets of compressed data of the prescribed size sz, in accordance with the algorithms α, β, γ, as a continuation of the second cycle. In the third cycle, compression of the whole of the object data D1 by algorithm β has been completed, when the sets of compressed data have each reached the prescribed size sz. The compression of the whole of the object data D1 by the algorithms α, γ is not completed in the third cycle.

In this way, when the size of the compressed data generated in each cycle is made uniform between the algorithms, the rate of progress is greater in the case of algorithm β which has a high compression ratio, and algorithm β completes compression first. Furthermore, since the algorithm β which has completed compression first is identified as the algorithm having the highest compression ratio, then the information processing device does not need to complete compression of the object data D1 by the other algorithms α, γ.

Consequently, the information processing device stops the fourth and subsequent cycles of compression (dotted points in FIG. 3). Therefore, the information processing device can omit the remainder of the compression based on the algorithms α and γ in the fourth and subsequent cycles, and the time taken for compression can be reduced.

In the example in FIG. 3, the generation of compressed data of the size "R(α)K−(sz*3)" relating to the algorithm α has not yet been completed, at the end of the third cycle. Similarly, the generation of compressed data of the size "R(γ)K−(sz*3)" relating to the algorithm γ has not yet been completed. Therefore, the information processing device can omit the generation of compressed data of the size that has not yet been completed.

In this way, by selecting the compressed data D2β of the algorithm β which has completed compression first, the information processing device is able rapidly to acquire the compressed data D2β from the algorithm β having the highest compression ratio among the plurality of algorithms α, β, γ. More specifically, the information processing device is able to acquire the compressed data D2 from the algorithm that yields the smallest data size after compression, for each set of object data D1.

Furthermore, the information processing device can acquire compressed data D2 of the algorithm having the highest compression ratio when compressing the whole of the object data D1. Therefore, even with object data D1 containing a mixture of text and images, etc., it is possible to accurately and rapidly acquire compressed data D2 from the algorithm having the highest compression ratio. Moreover, even if the plurality of algorithms include an algorithm such as LZ78 encoding, it is still possible to accurately and rapidly acquire compressed data D2 from the algorithm having the highest compression ratio.

Second Embodiment

Figure 4:
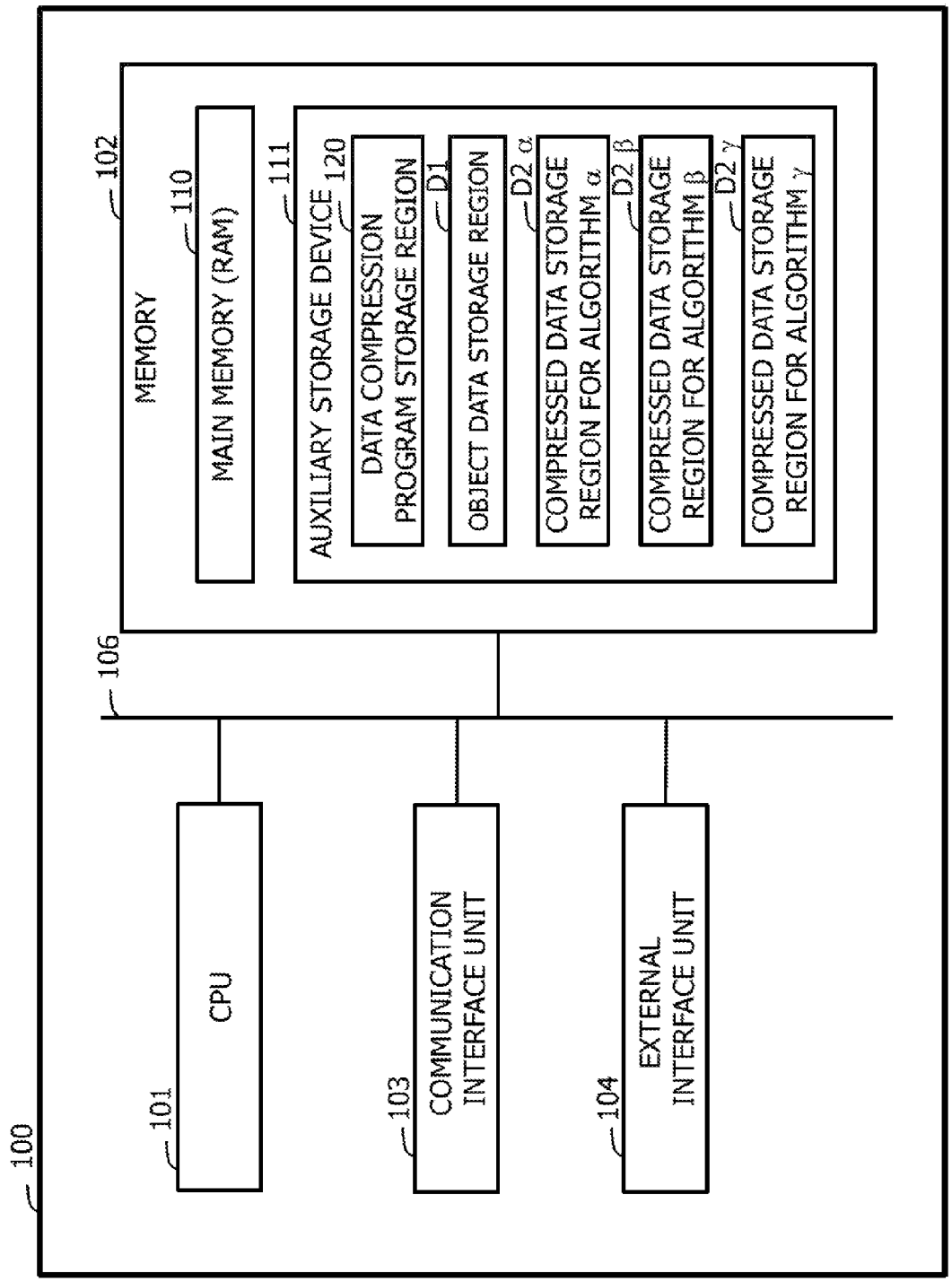
FIG. 4 is a schematic hardware diagram of an information processing device 100 according to the second embodiment.

FIG. 4 is a schematic hardware diagram of an information processing device 100 according to the second embodiment. The information processing device 100 has, for example, a CPU 101, a memory 102 provided with a main memory 110 and an auxiliary storage device 111, and the like, a communication interface unit 103, and an external interface unit 104. The units are mutually connected via a bus 106.

The CPU 101 is connected to the memory 102, etc. via the bus 106, and also controls the entire information processing device 100. The communication interface unit 103 is connected to other devices (not illustrated) and a memory device such as a storage device (not illustrated), and transmits and receives data, etc. The external interface unit 104 connects to other memory devices such as storage devices (not illustrated).

The main memory 110 which indicates a random access memory (RAM), etc. stores data, and the like, which is to be processed by the CPU 101. The auxiliary storage device 111 has a region (not illustrated) for storing an operating system program to be executed by the CPU 101, a data compression program storage region 120, and an object data storage region D1. Furthermore, the auxiliary storage device 111 has a compressed data storage region D2α for algorithm α, a compressed data storage region D2β for algorithm β, and a compressed data storage region D2γ for algorithm γ. The auxiliary storage device 111 indicates a hard disk drive (HDD), or non-volatile semiconductor memory, etc.

The data compression program of the data compression program storage region 120 (called "data compression program 120" below) is loaded into the main memory 110. The data compression process of the present embodiment is achieved by the CPU 101 executing the data compression program 120 that has been loaded into the main memory 110.

The object data in the object data storage region D1 (called "object data D1" below) is data that is the object of compression in the present embodiment. The compressed data in the compressed data storage region D2α for algorithm α (called "compressed data D2α of algorithm α" below) is compressed data in a case where the object data D1 has been compressed in accordance with the algorithm α.

The compressed data in the compressed data storage region D2β of the algorithm β (called the "compressed data D2β of algorithm β" below) is compressed data in a case where the object data D1 has been compressed in accordance with the algorithm β. The compressed data in the compressed data storage region D2γ of the algorithm γ (called the "compressed data D2γ of algorithm γ" below) is compressed data in a case where the object data D1 has been compressed in accordance with the algorithm γ.

[Software Functions of Information Processing Device 100]

Figure 5:
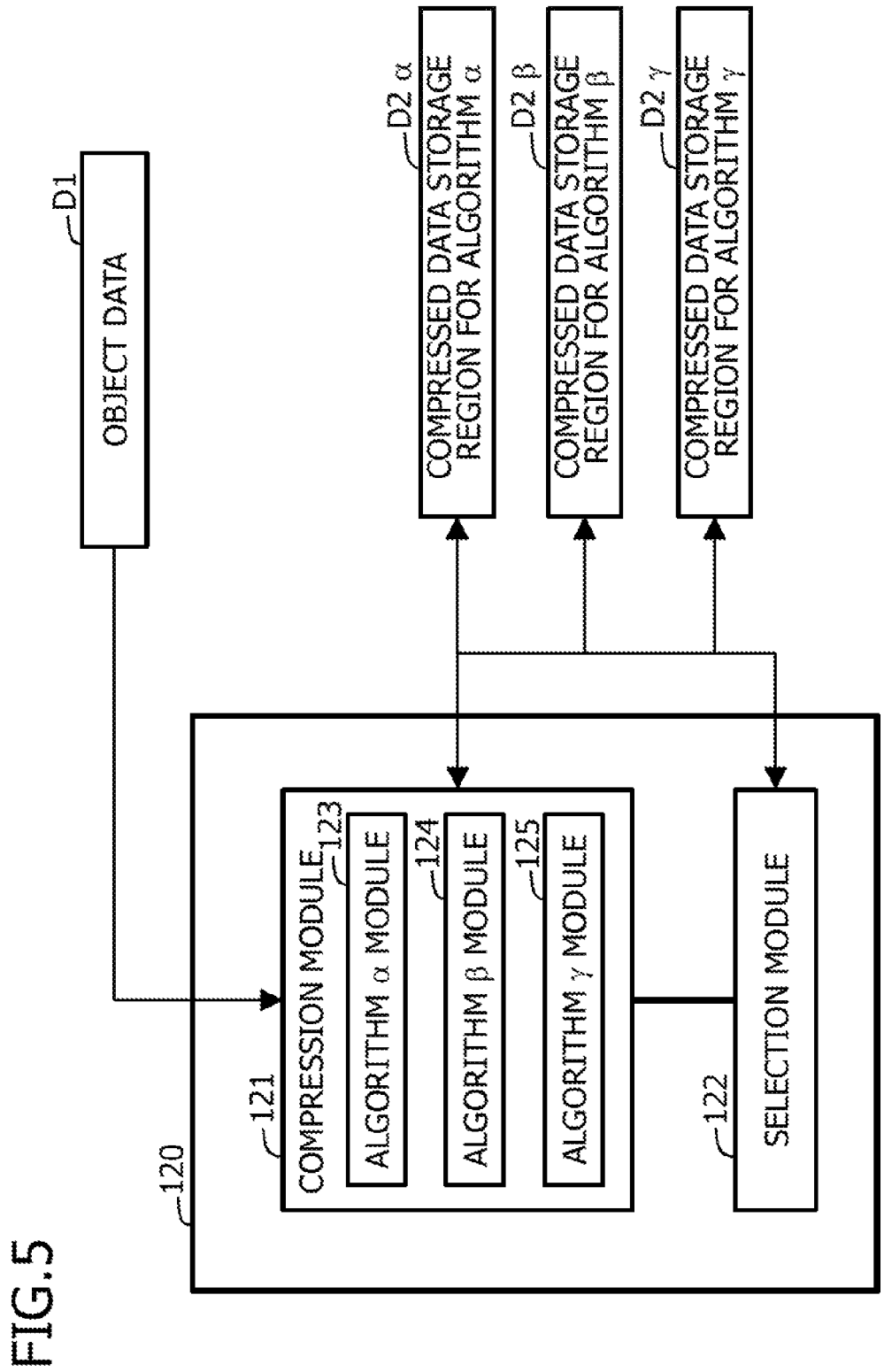
FIG. 5 is a diagram illustrating the software functions of the information processing device 100 according to the second embodiment.

FIG. 5 is a diagram illustrating the software functions of the information processing device 100 according to the second embodiment. In FIG. 5, items which are the same as those indicated in FIG. 4 are labelled with the same reference symbols. As indicated in FIG. 5, the data compression program 120 has, for example, a compression module 121 and a selection module 122.

Furthermore, the compression module 121 has an algorithm α module 123, an algorithm β module 124, and an algorithm γ module 125. The algorithm α module 123 is a module which executes compression by algorithm α. Furthermore, the algorithm β module 124 is a module which executes compression by the algorithm β, and the algorithm γ module 125 is a module which executes compression by the algorithm γ.

The compression module 121 calls up the modules 123 to 125 of the respective algorithms α, β, γ (also called "algorithm modules 123 to 125" below) and instructs a process for generating compressed data in sets of a prescribed size sz, in relation to the object data D1. The algorithm modules 123 to 125 add the generated compressed data to the corresponding compressed data D2 of the respective algorithms and store the data.

The selection module 122 selects the compressed data D2 of the algorithm which completes compression of the object data D1 first, among the plurality of algorithms. The selection module 122 uses the selected compressed data D2 to transmit data to other devices and store data in a memory device, etc.

[Processing of Data Compression Program 120]

Figure 6:
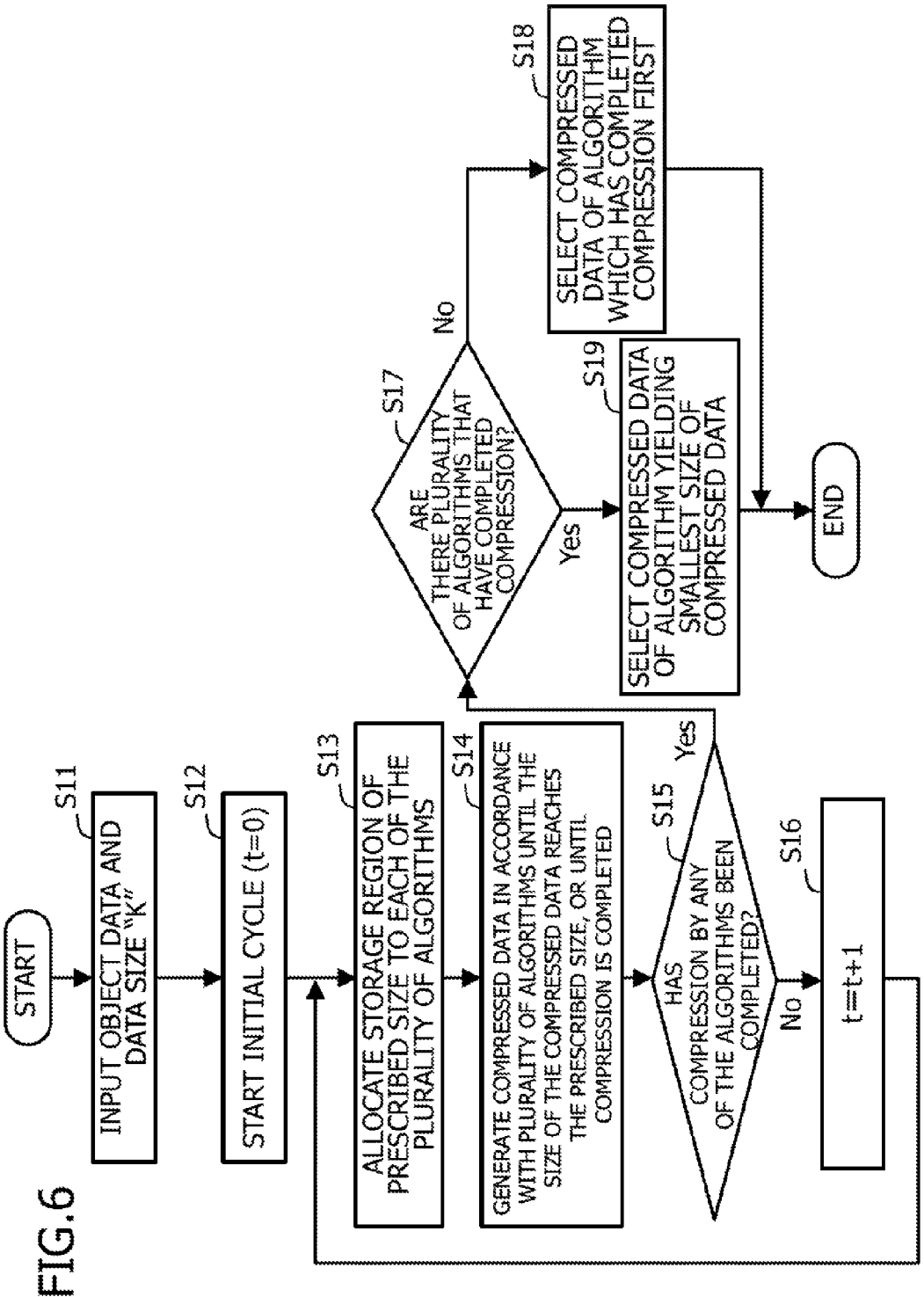
FIG. 6 is a flowchart illustrating the flow of processing of the data compression program 120 illustrated in FIGS. 4 and 5.

FIG. 6 is a flowchart illustrating the flow of processing of the data compression program 120 illustrated in FIGS. 4 and 5.

S11: The data compression program 120, upon starting, receives an input of object data D1 and the size "K" of the object data D1.

S12: The compression module 121 of the data compression program 120 reads out the object data D1 and instructs the start of the first cycle.

S13: The compression module 121 allocates a storage region of the prescribed size sz to each of the algorithm modules 123 to 125 (FIG. 5). The storage region is a region of the main memory 110 and/or auxiliary storage device 111, which is a working region that is used for compression processing.

When using a storage region such as a file system, the compression module 121 does not have to allocate a storage region to each of the algorithm modules 123 to 125 in advance. The algorithm modules 123 to 125 call up an application programming interface (API) of the file system and secure a storage region dynamically.

S14: The compression module 121 calls up the algorithm modules 123 to 125 and instructs them to generate compressed data of a prescribed size sz. The algorithm modules 123 to 125 generate compressed data until the size of the compressed data reaches the prescribed size sz, or until compression of the whole of the object data D1 has been completed. The algorithm modules 123 to 125 to add the generated compressed data to the compressed data D2 of the corresponding algorithm α, β, γ and store that data.

For example, the processing by the algorithm modules 123 to 125 is executed on the basis of a round robin method.

The round robin method is one type of process scheduling algorithm for an operating system, in which a plurality of processes are executed uniformly in order. For example, if the generation of compressed data of a prescribed size sz is finished quickly by a portion of the algorithms, then the CPU time is distributed to the processing by the other algorithm(s).

The method of processing by the algorithm modules 123 to 125 is not limited to a round robin method. The processing of the algorithm modules 123 to 125 may be executed in parallel by a multi-core CPU 101. Alternatively, the processing by the algorithm modules 123 to 125 may also be executed serially in order. The flow of the compression when executing processing in parallel or serially is described below with reference to FIGS. 7 and 8.

(Size of Compressed Data Generated in Each Cycle: Prescribed Size Sz)

The prescribed size sz is a prescribed ratio of the size of the object data D1, for example. The prescribed ratio is a ratio, such as "1/100", "1/1000", etc. of the object data D1. Furthermore, the prescribed ratio may also be a value that varies in accordance with the size of the object data D1. Alternatively, the prescribed size sz may be set to a fixed value, regardless of the size of the object data D1.

When the prescribed size sz is set to a small value, the size of the compressed data generated by each cycle becomes small, and therefore it is possible to raise the probability of compression being completed by only one algorithm during a cycle. On the other hand, if the prescribed size sz is made larger, then there is a possibility of compression being completed by more than one algorithm during the same cycle.

However, if the prescribed size sz is set to a small value, then the frequency of switching cycles is increased. Therefore, the overhead generated during switching of the cycles becomes larger and delays in processing may occur. Consequently, the prescribed size sz may be set, for example, on the basis of the overhead generated during switching.

S15: The selection module 122 of the data compression program 120 determines whether or not compression of the whole of the object data D1 has been completed by any one of the algorithms $\alpha$, $\beta$ or $\gamma$. According to the example in FIG. 3, none of the algorithms $\alpha$, $\beta$, $\gamma$ has completed compression of the whole of the object data D1 in the first and second cycles (No at S15).

S16: If compression of the object data D1 has not been completed by any of the algorithms (No at S15), then the compression module 121 increments the cycle [t] and then transfers to step S13. The compression module 121 then carries out a compression process as a continuation of the compression process in the previous cycle.

The compression module 121 repeats the process of generating compressed data in sets of a prescribed size until detecting an algorithm (compression method) which has completed compression of the object data first. In other words, the compression module 121 repeats a cycle of generating compressed data of a prescribed size sz, while there is no algorithm that has completed compression. Consequently, the compression module 121 can compress the object data D1 while maintaining a uniform size of the compressed data between the plurality of algorithms $\alpha$, $\beta$, $\gamma$.

S17: On the other hand, if compression of the whole of the object data D1 has been completed by any one of the algorithms (Yes at S15), then the selection module 122 determines whether or not there are a plurality of algorithms which have completed compression. According to the example in FIG. 3, in the third cycle, compression of the object data D1 is completed by one algorithm, algorithm $\beta$ (No at S17).

S18: If there is one algorithm that has completed compression (No at S17), then the selection module 122 selects the compressed data D2$\beta$ from the algorithm $\beta$ which has completed compression. Thereby, the selection module 122 is able to acquire the compressed data D2 from the algorithm which has completed compression first. Furthermore, the selection module 122 deletes the compressed data D2$\alpha$ of the algorithm $\alpha$ and the compressed data D2$\gamma$ of the algorithm $\gamma$ which have not yet completed compression, from the auxiliary storage device 111.

The selection module 122, for example, outputs the identifier "$\beta$" of the algorithm and the compressed data D2$\beta$, as a compression result. Alternatively, the selection module 122 may transmit the selected compressed data D2$\beta$ to another device (information processing device or storage device, etc.), via the communication interface unit 103 (FIG. 4). According to the present embodiment, it is possible to acquire compressed data D2$\beta$ having the smallest size based on the algorithm $\beta$ having the highest compression ratio. Therefore, it is possible to reduce the load on the network when transmitting the compressed data D2$\beta$.

Alternatively, the selection module 122 may store the selected compressed data D2$\beta$ in the auxiliary storage device 111 (FIG. 4) and/or a further storage device, or the like, which is connected via the external interface unit 104 (FIG. 4). Since it is possible to acquire the compressed data D2$\beta$ having the smallest size based on the algorithm $\beta$ having the highest compression ratio, then a large amount of data can be stored by the storage device.

S19: On the other hand, if there are a plurality of algorithms which have completed compression (Yes at S17), then this means that compression of the object data D1 has been completed by a plurality of algorithms in the same cycle. In this case, the selection module 122 selects the compressed data D2 of the smallest size, from among the plurality of algorithms which have completed compression.

In other words, if there are a plurality of algorithms (compression methods) which have completed compression of the object data D1 first, then the selection module 122 selects the compressed data D2 of smallest size, from among the sets of compressed data D2 of the plurality of algorithms which have completed compression of the object data D1 first. Accordingly, the selection module 122 is able accurately to acquire the compressed data D2 based on the algorithm having the highest compression ratio. One example of the processing in step S19 is described hereinafter with reference to FIG. 9.

As indicated in the flowchart in FIG. 6, the data compression program 120 determines whether or not there is a compression method that has completed compression of the object data, each time compressed data of a prescribed size sz is generated by the plurality of algorithms (compression methods). The data compression program 120 detects the algorithm (compression method) which has completed compression of the object data first.

Consequently, the data compression program 120 can accurately detect an algorithm that has completed compression of the object data D1 first, when compressed data is generated in sets of a prescribed size sz by the plurality of algorithms. In other words, the data compression program 120 is able to accurately detect an algorithm which has completed compression in the smallest number of cycles, by repeating generation of sets of compressed data of a prescribed size sz.

Furthermore, as indicated in the flowchart in FIG. 6, if compression by any one of the algorithms has completed (Yes at S15), then the data compression program 120 does not execute compression for the next and subsequent cycles. In other words, the data compression program 120 stops the process of generating compressed data in sets of the prescribed size sz by the other algorithms, when the algorithm (compression method) which has completed the compression of the object data D1 first has been detected.

In the present embodiment, the algorithm having the highest compression ratio is identified in the cycle in which compression by one of the algorithms is completed first. Therefore, it is not necessary to complete compression of the whole of the object data D1 by the other algorithms. Consequently, the data compression program 120 can omit unnecessary compression, by stopping compression by the other algorithms in the next and subsequent cycles. Accordingly, it is possible to shorten the compression time when carrying out speculative execution of compression in respect of all of the object data D1.

[Flow of Compression Steps by Each Algorithm]

Figure 7:
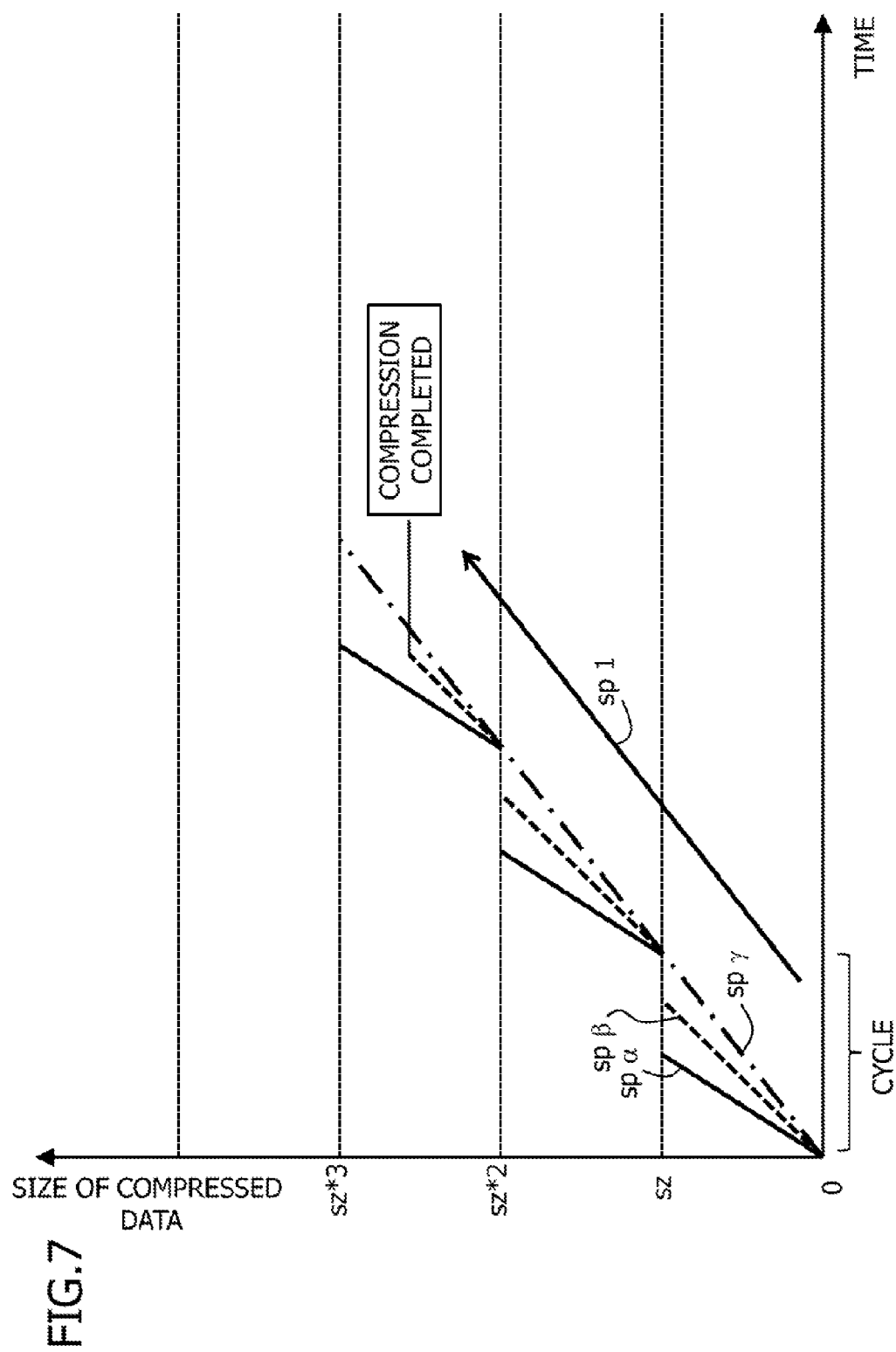
FIG. 7 is a diagram illustrating a flow of steps in a case where the generation of compressed data by the algorithms α, β, γ (S14 in FIG. 6) is executed in parallel.
Figure 8:
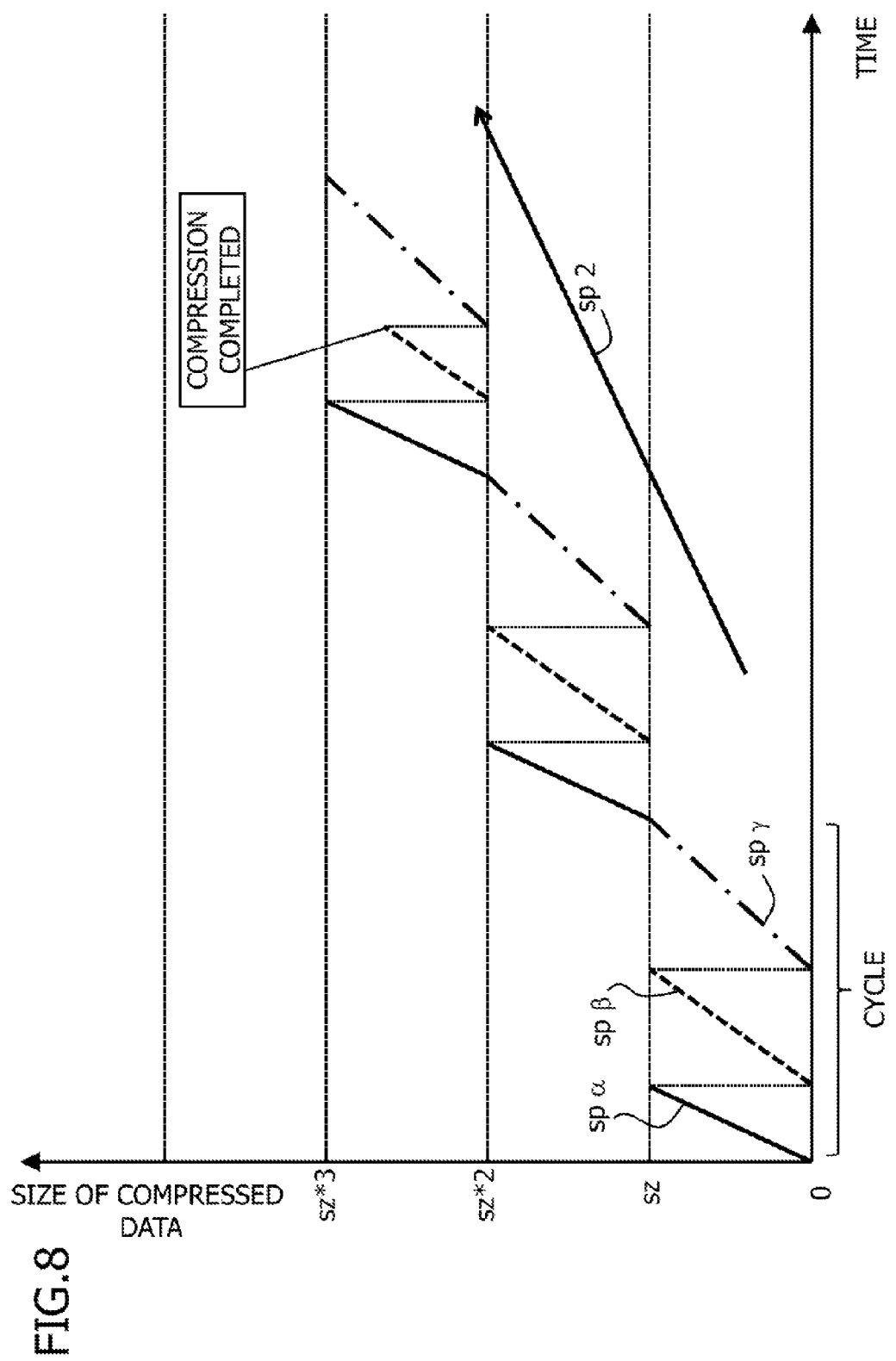
FIG. 8 is a diagram illustrating a flow of steps in a case where generation of compressed data by the algorithms α, β, γ (S14 in FIG. 6) is executed serially.

Next, the flow of compression steps by the algorithms α, β, γ based on the flowchart in FIG. 6 will be described with reference to FIGS. 7 and 8. FIG. 7 illustrates an example of a case where compression by the plurality of algorithms is executed in parallel and FIG. 8 illustrates an example of a case where compression by the plurality algorithms is executed in series.

FIG. 7 is a diagram illustrating a flow of steps in a case where the generation of compressed data by the algorithms α, β, γ (S14 in FIG. 6) is executed in parallel. The horizontal axis in FIG. 7 indicates time and the vertical axis indicates the size of the compressed data.

The solid diagonal line spα illustrated in FIG. 7 indicates the speed of generation of the compressed data by the algorithm α. Furthermore, the dotted diagonal line spβ illustrated in FIG. 7 indicates the speed of generation of the compressed data by the algorithm β and the dot-dash diagonal line spγ indicates the speed of generation of the compressed data by the algorithm γ. As illustrated in FIG. 7, of the algorithms α, β, γ, the generation speed spα of the algorithm α is the fastest and the generation speed spγ of the algorithm γ is the slowest.

Therefore, when the processes of generating compressed data of a prescribed size sz by each of the algorithms α, β, γ are executed in parallel, the processes end in the order: algorithm α, algorithm β, algorithm γ. If the processing by the algorithm α ends early within a particular cycle, then for example, the resources of the CPU 101 are allocated to the processing by the other algorithms β, γ.

Furthermore, the arrow sp1 illustrated in FIG. 7 indicates the speed of generation of the compressed data in each cycle. The data compression program 120 according to the present embodiment makes the size of the compressed data generated in each cycle uniform between each of the algorithms. Therefore, although the generation speeds spα, spβ, spγ of the compressed data by the respective algorithms are different, since the size of the compressed data generated in each cycle is uniform, then the generation speed sp1 of compressed data in each cycle is uniform between the algorithms.

Similarly to the example in FIG. 3, in the example in FIG. 7, compression of the whole of the object data D1 by the algorithm β is completed in the third cycle. According to the example in FIG. 7, when the compression by the algorithm β is completed, the processing for generating compressed data of the prescribed size sz for the third cycle has not yet been completed by the algorithms α, γ. Furthermore, there is also a possibility that algorithm α and/or γ may complete compression of the whole of the object data D1 in the third cycle.

Therefore, the processing for generating compressed data of the prescribed size for the third cycle is executed by the algorithms α and γ also. If there are a plurality of algorithms which have completed compression at the end of the third cycle, then the algorithm having the highest compression ratio is identified on the basis of the sizes of the sets of compressed data D2 produced by these plurality of algorithms.

Thereby, supposing that compression is completed by another algorithm in addition to the algorithm β during the third cycle, then it is possible to select the algorithm having the highest compression ratio, from the algorithm β and the other algorithm. On the other hand, if compression has been completed only by algorithm β during the third cycle, then the size of the compressed data D2β of the algorithm β is the smallest, and the compression ratio of algorithm β is determined to be the highest.

FIG. 8 is a diagram illustrating a flow of steps in a case where generation of compressed data by the algorithms α, β, γ (S14 in FIG. 6) is executed serially. Similarly to FIG. 7, the horizontal axis in FIG. 8 indicates time and the vertical axis indicates the size of the compressed data after compression. The solid diagonal line spα, the dotted diagonal line spβ and the dot-dash diagonal line spγ are also the same as FIG. 7.

The arrow sp2 illustrated in FIG. 8 indicates the speed of generation of the compressed data in each cycle. In the example in FIG. 8, the data compression program 120 executes the process of generating compressed data by each algorithm, in sequential fashion.

More specifically, the data compression program 120 executes the processing for generating compressed data of the prescribed size by the algorithm β, after completing the generation of compressed data of the prescribed size by the algorithm α. Furthermore, the data compression program 120 executes the processing for generating compressed data of the prescribed size by the algorithm γ, after completing the generation of compressed data of the prescribed size by the algorithm β.

Therefore, the generation speed sp2 of the compressed data in each cycle which is indicated in FIG. 8 is slower than the generation speed sp1 of the compressed data indicated in FIG. 7. As illustrated in FIG. 7, although the generation speeds spα, spβ and spγ of the algorithms are different, the generation speed sp2 of compressed data in each cycle is the same for each of the algorithms.

Furthermore, in the example in FIG. 8, even after compression has been completed by the algorithm β during the third cycle, the data compression program 120 still executes processing for generating compressed data of the prescribed size for the third cycle, by the algorithm γ.

As illustrated in FIGS. 7 and 8, the data compression program 120 according to the present embodiment compresses the object data D1 while keeping the size of the generated compressed data uniform between each of the algorithms. Therefore, by selecting the compressed data D2 from the algorithm which has completed compression in the smallest number of cycles, among the plurality of algorithms, it is possible rapidly to acquire the compressed data D2 from the algorithm having the highest compression ratio.

[Example where Compression is Completed by a Plurality of Algorithms in the Same Cycle]

FIG. 9 illustrates a schematic view of a flow of processing in a case where compression of the whole of the object data D1 is completed by a plurality of algorithms during the same cycle. In FIG. 9, the same parts as those illustrated in FIG. 3 are labelled with the same reference symbols.

FIG. 9 illustrates an example of a case where compression of the object data D1 by the algorithms β, γ is completed in the third cycle (Yes at S17 in FIG. 6). Therefore, at the end of the third cycle, the compression module 121 compares the sizes of the compressed data D2β of the algorithm β and the compressed data D2γ of the algorithm γ, and selects the compressed data D2β which is smaller in size (S19).

Thereby, the data compression program 120 of the present embodiment selects the compressed data D2 having the smaller size, when there is more than one compression method that completes compression first. Accordingly, the data compression program 120 accurately determines the algorithm having the highest compression ratio and can select the compressed data D2 from that algorithm.

Further Embodiments

In the present embodiment, a case has been described in which the prescribed size sz was uniform in all of the cycles. However, the invention is not limited to this example. The prescribed size sz may be varied between cycles.

Later cycles have a higher probability than early cycles of being the final cycle in which compression of the object data D1 is completed by one of the algorithms. Therefore, for instance, the data compression program 120 may change the prescribed size sz so as to be smaller, as the number of cycles increases. Alternatively, the data compression program 120 may change the prescribed size sz to a smaller value when the number of cycles exceeds a reference value.

Consequently, in earlier cycles, it is possible to reduce the overhead in the determination process by reducing the frequency of switching cycles. Furthermore, in the final cycle in which compression is completed by one of the algorithms, since the prescribed size sz is small, then the size of the compressed data generated by each algorithm can be reduced. Therefore, it is possible to suppress unnecessary compression processing by the other algorithms apart from the algorithm having the highest compression ratio. Furthermore, it also becomes possible to reduce the probability of compression being completed by more than one algorithm in the final cycle.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. An information processing device comprising:
   a memory; and
   a processor coupled to the memory and the processor configured to:
   generate compressed data, in sets of a prescribed size, in respect of one set of object data, in accordance with each of a plurality of compression methods;
   determine, each time compressed data of the prescribed size is generated by the plurality of compression methods, whether there is a compression method which has completed compression of the object data;
   detect the compression method which has completed compression of the object data first; and
   stop generation of the compressed data by a compression method other than the detected compression method among the plurality of compression methods when the compression method which has completed compression of the object data first has been detected.

2. The information processing device according to claim 1, wherein, in a case where there are a plurality of the compression methods which have completed compression of the object data first, the processor selects compression data having smallest size among compression data generated by each of the plurality of compression methods which have completed compression of the object data first.

3. The information processing device according to claim 1, wherein the processor repeats generation of the compressed data until the compression method which has completed compression of the object data first is detected.

4. The information processing device according to claim 1, wherein the processor further executes either transmission of the selected compressed data to another device or storage of the selected compressed data in a storage device.

5. A data compression method, comprising:
   generating compressed data, by a processor, in sets of a prescribed size, in respect of one set of object data, in accordance with each of a plurality of compression methods;
   determining, by a processor, each time compressed data of the prescribed size is generated by the plurality of compression methods, whether there is a compression method which has completed compression of the object data;
   detecting, by a processor, the compression method which has completed compression of the object data first; and
   stopping, by a processor, the generation of the compressed data by a compression method other than the detected compression method among the plurality of compression methods when the compression method which has completed compression of the object data first has been detected.

6. A non-transitory computer-readable storage medium storing therein a data compression program that causes a computer to execute a process comprising:
   generating compressed data, in sets of a prescribed size, in respect of one set of object data, in accordance with each of a plurality of compression methods;
   determining, each time compressed data of the prescribed size is generated by the plurality of compression methods, whether there is a compression method which has completed compression of the object data; and
   detecting the compression method which has completed compression of the object data first.

* * * * *